(12) United States Patent
Minamisawa

(10) Patent No.: US 11,747,643 B2
(45) Date of Patent: Sep. 5, 2023

(54) OPTICAL UNIT WITH SHAKE CORRECTION FUNCTION

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 63 days.

(21) Appl. No.: 17/364,898

(22) Filed: Jul. 1, 2021

(65) Prior Publication Data

US 2022/0019087 A1   Jan. 20, 2022

(30) Foreign Application Priority Data

Jul. 16, 2020   (JP) .................................. 2020-122046

(51) Int. Cl.
| | | |
|---|---|---|
| G02B 27/64 | (2006.01) | |
| G03B 5/06 | (2021.01) | |
| H05K 1/02 | (2006.01) | |
| H04N 23/57 | (2023.01) | |

(52) U.S. Cl.
CPC .............. *G02B 27/646* (2013.01); *G03B 5/06* (2013.01); *H04N 23/57* (2023.01); *H05K 1/028* (2013.01)

(58) Field of Classification Search
CPC ........ H05K 1/028; H04N 5/2257; G03B 5/06; G02B 27/646
See application file for complete search history.

(56) References Cited

U.S. PATENT DOCUMENTS

| | | | |
|---|---|---|---|
| 9,332,188 B2 | 5/2016 | Takei et al. | |
| 2014/0171159 A1* | 6/2014 | Endo | H01Q 1/243 343/904 |
| 2015/0277140 A1* | 10/2015 | Minamisawa | G03B 5/06 359/557 |
| 2021/0029275 A1* | 1/2021 | Choi | H04M 1/0277 |
| 2021/0251082 A1* | 8/2021 | Ono | G03B 5/06 |

FOREIGN PATENT DOCUMENTS

| | | |
|---|---|---|
| CN | 103688217 | 3/2014 |
| CN | 110501855 | 11/2019 |
| JP | 2008287159 | 11/2008 |
| JP | 2011211872 | 10/2011 |
| JP | 2014089243 | 5/2014 |
| JP | 2014137514 | 7/2014 |
| JP | 2020086367 | 6/2020 |
| WO | 2019221021 | 11/2019 |

* cited by examiner

*Primary Examiner* — Noam Reisner
(74) *Attorney, Agent, or Firm* — JCIPRNET

(57) ABSTRACT

An optical unit with a shake correction function includes a movable body, a fixed body, a swing support mechanism structured to swingably support the movable body, a shake correction drive mechanism structured to swing the movable body, and a flexible printed circuit board extended from the movable body. The flexible printed circuit board is provided with a flat face part between the movable body and a circuit board fixing part provided in the fixed body, and a fixed part which is fixed to the circuit board fixing part. The flat face part is provided with a curved part, the fixed part is positioned in the optical axis direction by abutting with the circuit board fixing part, the circuit board fixing part comprises a fixable region capable of fixing the fixed part, and a width of the fixable region is larger than a width of the fixed part.

18 Claims, 6 Drawing Sheets

OPTICAL UNIT WITH SHAKE CORRECTION FUNCTION

CROSS REFERENCE TO RELATED APPLICATION

The present invention claims priority under 35 U.S.C. § 119 to Japanese Application No. 2020-122046 filed Jul. 16, 2020, and the entire content of which is incorporated herein by reference.

TECHNICAL FIELD

At least an embodiment of the present invention may relate to an optical unit with a shake correction function which is structured to swing an optical module to perform a shake correction.

BACKGROUND

Some optical units mounted on a portable terminal or a movement body includes a mechanism which is structured to swing or turn a movable body having an optical module to correct a shake in order to restrain disturbance of a photographed image of the portable terminal or when the movement body is moved. Such an optical unit with a shake correction function is disclosed in Japanese Patent Laid-Open No. 2020-86367 (Patent Literature 1).

An optical unit with a shake correction function described in Patent Literature 1 includes a movable body having an optical module, a fixed body, and a swing support mechanism which turnably supports the movable body with respect to the fixed body around turning axes ("X"-axis and "Y"-axis) intersecting an optical axis. A flexible printed circuit board (flexible wiring board) connected with the optical module is extended from the movable body. An end part (fixed end) of the flexible printed circuit board is fixed to a positioning part provided in the fixed body.

In the optical unit with a shake correction function, the movable body is swung while resiliently bending the flexible printed circuit board. In this case, there may occur that movement of the movable body is obstructed by a spring property provided in the flexible printed circuit board and a swing load to the movable body is increased. In Patent Literature 1, the flexible printed circuit board is extended and provided for easily resiliently bending in a shape that the flexible printed circuit board is folded back so as to overlap with each other when viewed in an optical axis direction.

However, operations that a flexible printed circuit board is folded back a plurality of times require much time and labor, and a lot of tact times is required. Further, a jig is required to use for stabilizing a bending shape and a process is also required for preventing deformation of the flexible printed circuit board after having been bent.

Further, when a bending dimension of the flexible printed circuit board varies, a position of a fixed end of the flexible printed circuit board is varied. Conventionally, when a fixed end of the flexible printed circuit board is to be fixed to a fixed body, a recessed part or a hole for positioning which is provided in the fixed end is fitted to a positioning part of the fixed body. However, if the recessed part or the hole is forcibly fitted in a state that the position of the fixed end deviates, propping or deformation occurs in the flexible printed circuit board. As a result, a force is applied to the movable body from the flexible printed circuit board and thus, an initial position of the movable body is deviated and a smooth movement of the movable body is obstructed. Therefore, stable characteristics of the actuator are not obtained.

SUMMARY

In view of the problems described above, at least an embodiment of the present invention may advantageously provide an optical unit with a shake correction function which is capable of restraining an increase of a swing load to a movable body and deterioration of characteristics of an actuator which are caused by the flexible printed circuit board.

According to at least an embodiment of the present invention, there may be provided an optical unit with a shake correction function including a movable body having an optical module, a fixed body, a swing support mechanism which is structured to swingably support the movable body with respect to the fixed body around a first axis intersecting an optical axis and is structured to swingably support the movable body around a second axis intersecting the optical axis and the first axis, a shake correction drive mechanism structured to swing the movable body around the first axis and around the second axis, and a flexible printed circuit board which is extended from the movable body. In addition, in a case that a direction perpendicular to the optical axis is referred to as a first direction and a direction perpendicular to the optical axis and perpendicular to the first direction is referred to as a second direction, the fixed body is provided with a circuit board fixing part which is separated in the first direction from the movable body. The flexible printed circuit board is provided with a flat face part disposed in an imaginary plane intersecting the optical axis between the movable body and the circuit board fixing part and a fixed part which is fixed to the circuit board fixing part. The flat face part is provided with a curved part which is curved in the imaginary plane, the fixed part is positioned in a direction of the optical axis by abutting with the circuit board fixing part, the circuit board fixing part is provided with a fixable region which is capable of fixing the fixed part, and a width in the second direction of the fixable region is larger than a width in the second direction of the fixed part.

According to at least an embodiment of the present invention, the flexible printed circuit board which is connected with the movable body is provided with a flat face part disposed in an imaginary plane intersecting the optical axis, and the flat face part is provided with a curved part which is curved in the imaginary plane. Therefore, a shape which is easily resiliently bent is obtained without performing a folding work of the flexible printed circuit board and thus, time and labor for providing the flexible printed circuit board can be reduced. Further, a width in the second direction of the fixable region of the circuit board fixing part provided in the fixed body is larger than a width of the fixed part provided in the flexible printed circuit board. Therefore, when the flexible printed circuit board is to be fixed to the circuit board fixing part, propping and deformation of the flexible printed circuit board can be restrained by shifting a position of the fixed part in the second direction. As a result, the flexible printed circuit board can be disposed in a natural state and thus, an unintended force can be restrained from applying to the movable body due to lowering of shape accuracy of the flexible printed circuit board. Therefore, increase of a swing load to the movable body and deterioration of actuator characteristics caused by the flexible printed circuit board can be suppressed.

In at least an embodiment of the present invention, a width in the first direction of the fixable region is larger than a width in the first direction of the fixed part. According to this structure, when the flexible printed circuit board is to be fixed to the circuit board fixing part, propping and deformation of the flexible printed circuit board can be restrained by shifting a position in the first direction of the fixed part and thus, the flexible printed circuit board can be disposed in a natural state. Therefore, increase of a swing load to the movable body and deterioration of the actuator characteristics caused by the flexible printed circuit board can be suppressed.

In at least an embodiment of the present invention, the flat face part is inclined with respect to the first direction, the circuit board fixing part is provided with a fixing face with which the fixed part is abutted, and the fixing face is inclined in the same direction as the flat face part. According to this structure, inclinations of the flat face part and the fixed part can be set the same as each other and thus, the flexible printed circuit board can be disposed without bending the flat face part and the fixed part. As a result, the flexible printed circuit board can be disposed in a natural state and thus, an unintended force can be restrained from applying to the movable body from the flexible printed circuit board. Further, interference of the flexible printed circuit board with the fixed body can be prevented.

In at least an embodiment of the present invention, the flat face part is inclined in a direction toward a side in the direction of the optical axis where a swing center of the movable body is located as approaching the movable body in the first direction. According to this structure, a distance between the imaginary plane where the flexible printed circuit board is disposed and the swing center of the movable body can be made small. Therefore, increase of a swing load to the movable body due to resilient bending of the flexible printed circuit board can be restrained.

In at least an embodiment of the present invention, an intersecting point of the imaginary plane with the optical axis is coincided with a swing center of the movable body. According to this structure, increase of a swing load to the movable body due to resilient bending of the flexible printed circuit board can be restrained.

In at least an embodiment of the present invention, the flat face part intersects the first axis and the second axis. According to this structure, when the movable body is swung around the first axis and around the second axis, a load is reduced when the flat face part is resiliently bent by following movement of the movable body. Therefore, increase of a swing load to the movable body due to resilient bending of the flexible printed circuit board can be restrained.

In at least an embodiment of the present invention, the curved part is provided with a first curved part and a second curved part which are curved in reverse directions in the imaginary plane. The flat face part is provided with a first straight part which is extended in the first direction, the first curved part which is curved from the first straight part in a reverse direction, a second straight part which is extended from the first curved part in substantially parallel with the first straight part, the second curved part which is curved from the second straight part in a reverse direction, and a third straight part which is extended from the second curved part in substantially parallel with the second straight part. As described above, in a case that a planar shape of the flexible printed circuit board is formed in a meandering shape, when the movable body is swung around the first axis and around the second axis which intersect the optical axis, the flexible printed circuit board is capable of being easily resiliently bent. Therefore, a swing load to the movable body can be restrained from increasing.

In at least an embodiment of the present invention, the flexible printed circuit board is provided with an extending part which is extended from the movable body to a side where the circuit board fixing part is located, a first bent part which is bent from the extending part in a direction approaching a swing center of the movable body in a direction of the optical axis, and a second bent part which is bent in a direction along the imaginary plane between the first bent part and the flat face part. According to this structure, a position in the optical axis direction of the flexible printed circuit board can be brought close to the swing center of the movable body. Therefore, increase of a swing load to the movable body due to resilient bending of the flexible printed circuit board can be restrained.

In at least an embodiment of the present invention, the optical unit with a shake correction function further includes a bending assist member which holds the first bent part and the second bent part. According to this structure, shapes of the first bent part and the second bent part can be maintained and thus, in a state that a position in the optical axis direction of the flat face part is brought close to the swing center of the movable body, a shape of the flexible printed circuit board is easily maintained.

Effects of the Invention

According to at least an embodiment of the present invention, the flexible printed circuit board which is connected with the movable body is provided with a flat face part disposed in an imaginary plane intersecting the optical axis, and the flat face part is provided with a curved part which is curved in the imaginary plane. Therefore, a shape which is easily resiliently bent is obtained without performing a folding work of the flexible printed circuit board and thus, time and labor for providing the flexible printed circuit board can be reduced. Further, a width in the second direction of the fixable region of the circuit board fixing part provided in the fixed body is larger than a width of the fixed part provided in the flexible printed circuit board. Therefore, when the flexible printed circuit board is to be fixed to the circuit board fixing part, propping and deformation of the flexible printed circuit board can be restrained by shifting a position of the fixed part in the second direction. As a result, the flexible printed circuit board can be disposed in a natural state and thus, an unintended force can be restrained from applying to the movable body due to lowering of shape accuracy of the flexible printed circuit board. Therefore, increase of a swing load to the movable body and deterioration of actuator characteristics caused by the flexible printed circuit board can be suppressed.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An embodiment of an optical unit with a shake correction function to which the present invention is applied will be described below with reference to the accompanying drawings.

(Entire Structure)

Figure 1:
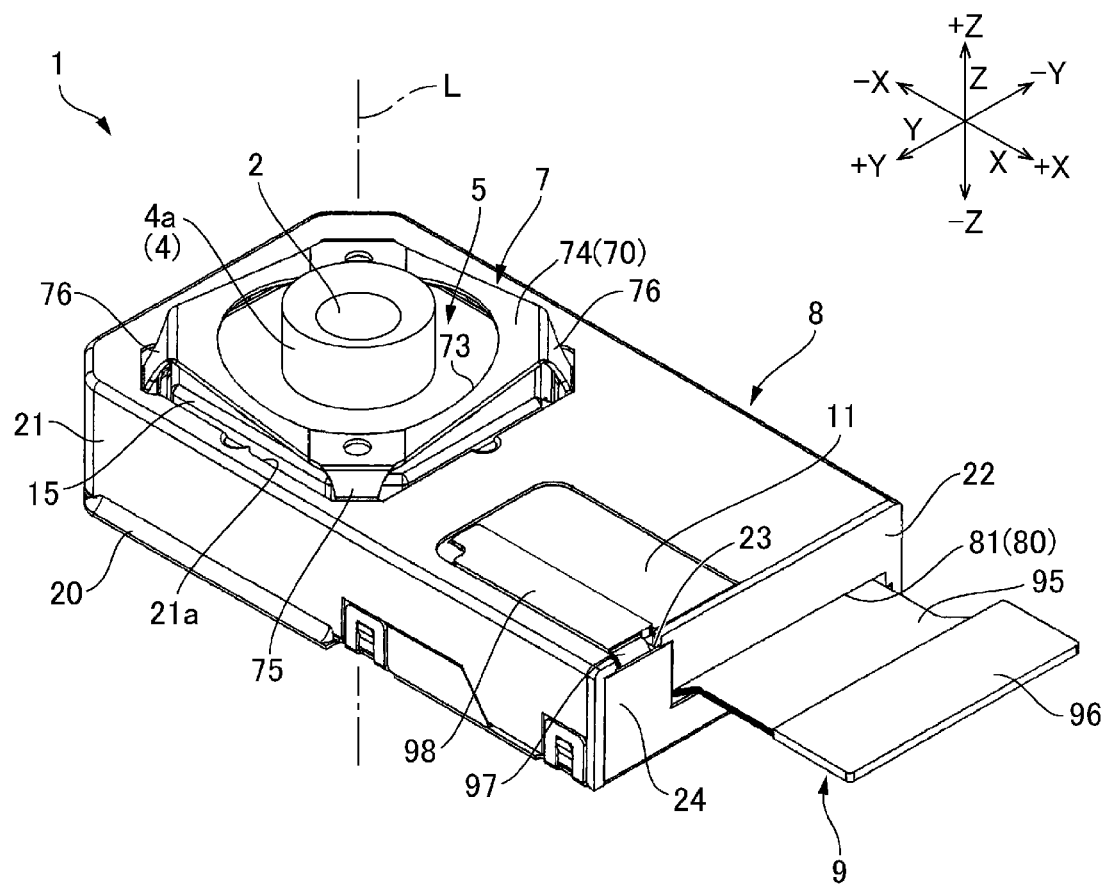
FIG. 1 is a perspective view showing an optical unit with a shake correction function to which the present invention is applied.
Figure 2:
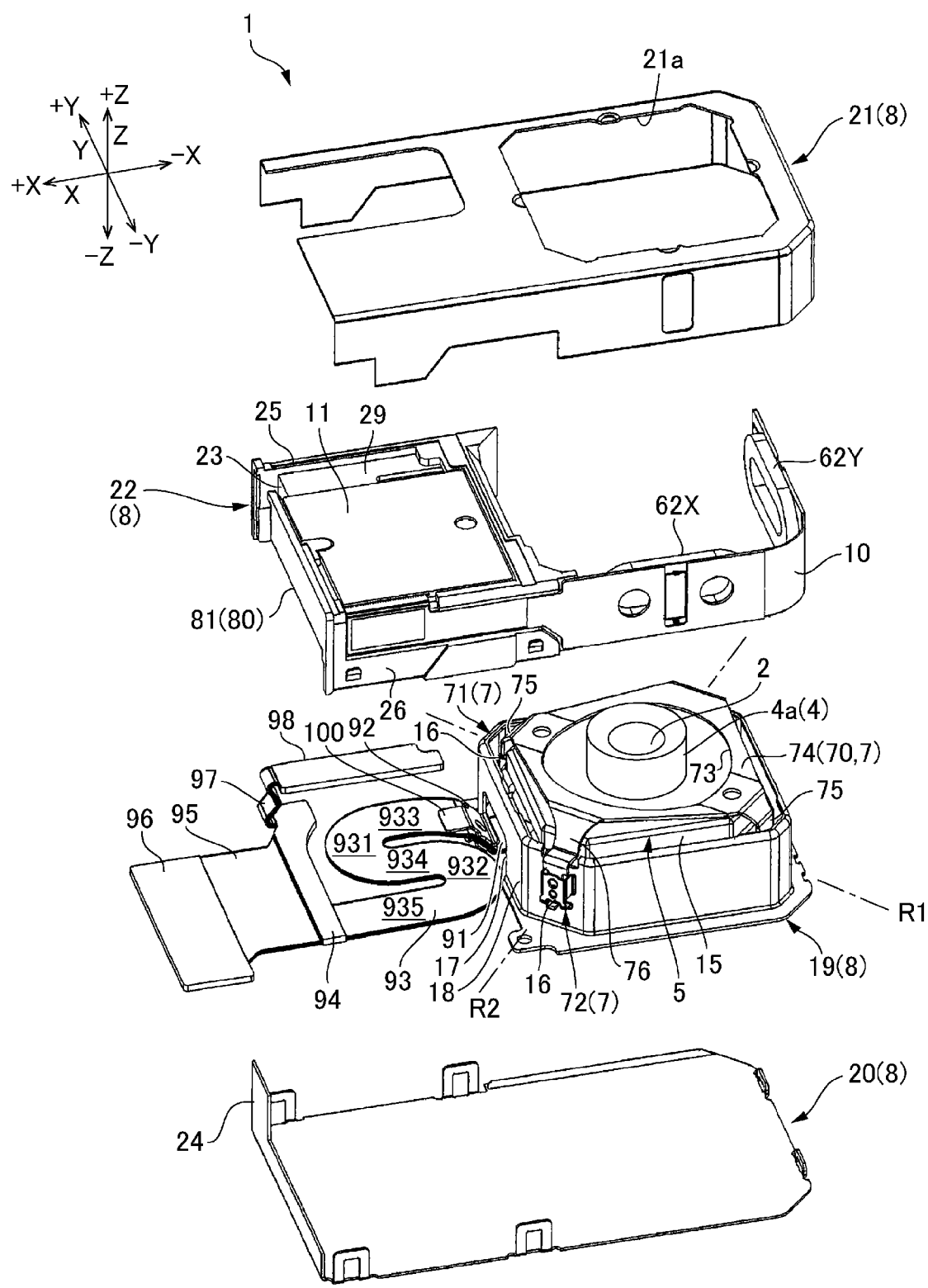
FIG. 2 is an exploded perspective view showing the optical unit with a shake correction function in FIG. 1.
Figure 3:
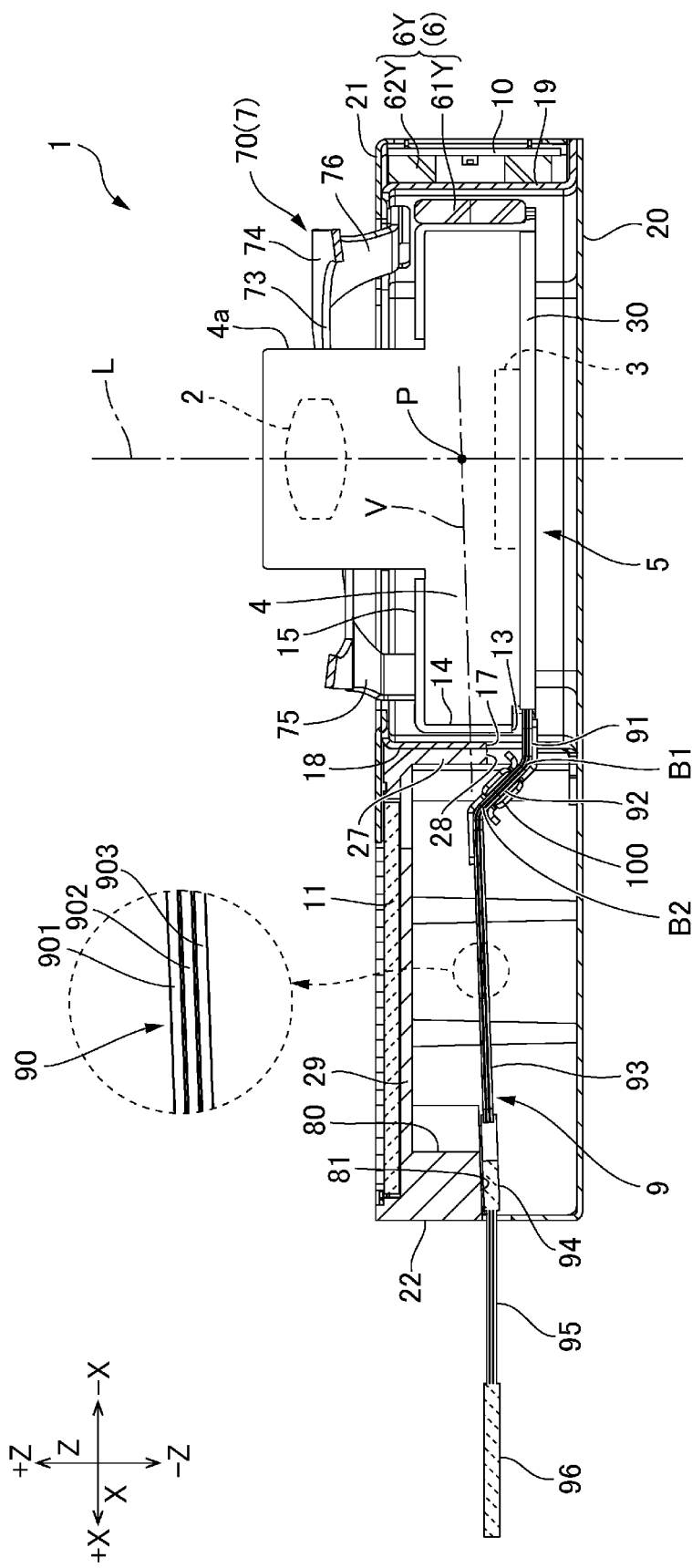
FIG. 3 is a cross-sectional view showing the optical unit with a shake correction function which is cut by an "X-Z" plane.
Figure 4:
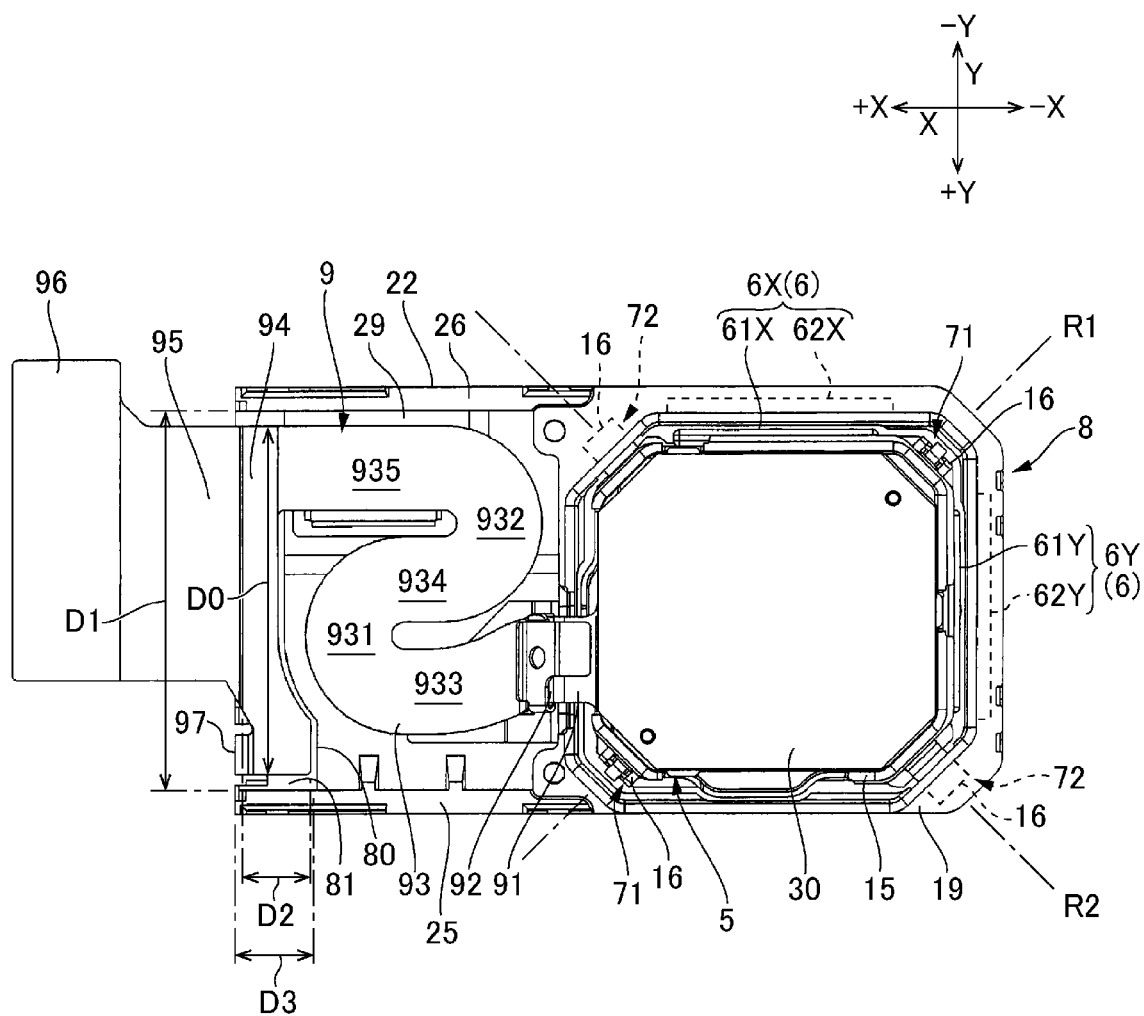
FIG. 4 is a bottom view showing the optical unit with a shake correction function in which a base is detached and which is viewed from an image side.
Figure 5:
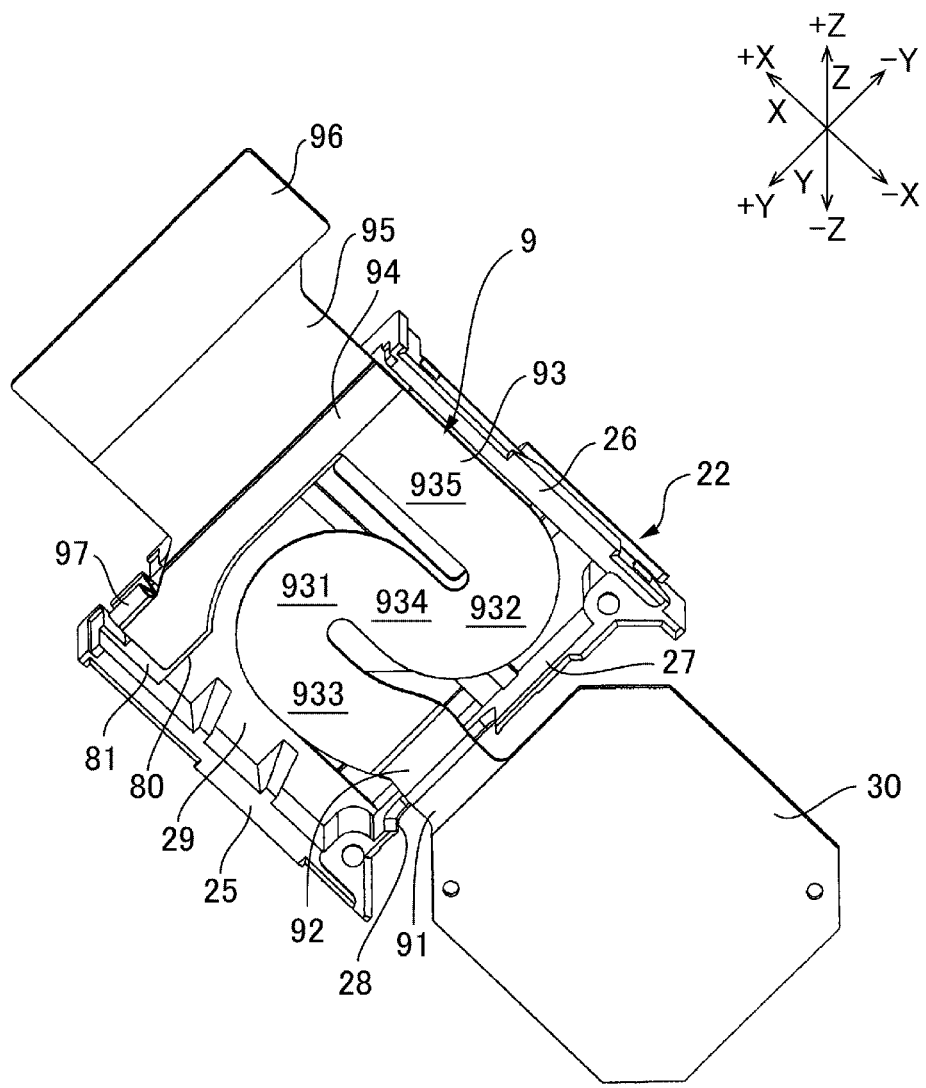
FIG. 5 is a perspective view showing the optical unit with a shake correction function in which a base is detached and which is viewed from an image side.

FIG. 1 is a perspective view showing an optical unit 1 with a shake correction function to which the present invention is applied. FIG. 2 is an exploded perspective view showing the optical unit 1 with a shake correction function in FIG. 1. FIG. 3 is a cross-sectional view showing the optical unit 1 with a shake correction function which is cut by an "X-Z" plane. FIG. 4 is a bottom view showing the optical unit 1 with a shake correction function in which a base 20 is detached and which is viewed from an image side. FIG. 5 is a perspective view showing the optical unit 1 with a shake correction function in which the base 20 is detached and which is viewed from the image side.

An optical unit 1 with a shake correction function includes an optical module 4 having a lens 2 and an imaging element 3 (see FIG. 3). The optical unit 1 with a shake correction function is, for example, used in an optical device such as a cell phone with a camera and a drive recorder or in an optical device such as an action camera mounted on a movement body such as a helmet, a bicycle, a radio-controlled helicopter or a wearable camera. In the optical device, when a shake is occurred in the optical device at a time of photographing, a disturbance is generated in a photographed image. In order to avoid a photographed image being inclined, the optical unit 1 with a shake correction function corrects an inclination of the optical module 4 based on acceleration, angular velocity, shaking amount and the like detected by a detection means such as a gyroscope.

The optical unit 1 with a shake correction function is structured to turn the optical module 4 around a first axis "R1" (see FIG. 2) perpendicular to an optical axis "L" of the lens 2 provided in the optical module 4 and to turn the optical module 4 around a second axis "R2" (see FIG. 2) perpendicular to the optical axis "L" and the first axis "R1" and thereby a shake correction is performed. The optical unit 1 with a shake correction function in this embodiment performs a pitching correction and a yawing correction.

In the following descriptions, three axes perpendicular to each other are referred to as an "X"-axis, a "Y"-axis and a "Z"-axis. The "Z"-axis is coincided with the optical axis "L". In a case that a plane including the "X"-axis and the "Y"-axis is defined as an "X-Y" plane, the first axis "R1" and the second axis "R2" are located on the "X-Y" plane. The first axis "R1" and the second axis "R2" are inclined by 45 degrees with respect to the "X"-axis and the "Y"-axis.

Further, in the following descriptions, directions along the "X"-axis, the "Y"-axis and the "Z"-axis are referred to as an "X"-axis direction, a "Y"-axis direction and a "Z"-axis direction. One side in the "X"-axis direction is referred to as a "−X" direction and the other side is referred to as a "+X" direction, one side in the "Y"-axis direction is referred to as a "−Y" direction and the other side is referred to as a "+Y" direction, and one side in the "Z"-axis direction is referred to as a "−Z" direction and the other side is referred to as a "+Z" direction. The "X"-axis direction is a first direction, and the "Y"-axis direction is a second direction. The "Z"-axis direction is an optical axis direction along the optical axis "L". The "−Z" direction is an image side of the optical module 4, and the "+Z" direction is an object side of the optical module 4. Further, a direction along the first axis "R1" is a first axis "R1" direction, and a direction along the second axis "R2" is a second axis "R2" direction.

As shown in FIGS. 1 and 2, the optical unit 1 with a shake correction function includes a movable body 5 having an optical module 4, a gimbal mechanism 7, a fixed body 8 which supports the movable body 5 through the gimbal mechanism 7, a shake correction drive mechanism 6 and flexible printed circuit boards 9 and 10. The flexible printed circuit board 9 is connected with the movable body 5. The flexible printed circuit board 10 for power feeding to the shake correction drive mechanism 6 is fixed to the fixed body 8.

The gimbal mechanism 7 is a swing support mechanism which swingably supports the movable body 5 around the first axis "R1" and around the second axis "R2". The movable body 5 is turnable in a pitching direction around the "X"-axis and in a yawing direction around the "Y"-axis by combining turning around the first axis "R1" and turning around the second axis "R2".

The shake correction drive mechanism 6 includes a first shake correction drive mechanism 6X structured to generate a drive force around the "X"-axis with respect to the movable body 5, and a second shake correction drive mechanism 6Y structured to generate a drive force around the "Y"-axis with respect to the movable body 5. As shown in FIG. 4, in this embodiment, the first shake correction drive mechanism 6X is disposed on the "−Y" direction side of the movable body 5. The second shake correction drive mechanism 6Y is disposed on the "−X" direction side of the movable body 5.

(Movable Body)

As shown in FIG. 3, the movable body 5 includes the optical module 4 and a holder 15 which is made of metal and surrounds the optical module 4. The optical module 4 includes a lens-barrel 4a which is protruded to the "+Z" direction side from a center of the holder 15, and a lens 2 is held by the lens-barrel 4a. A circuit board 30 is disposed at an end part on the "−Z" direction side of the optical module 4.

The flexible printed circuit board 9 is connected with the circuit board 30 on which the imaging element 3 is mounted and is extended to the "+X" direction side from an end part on the "−Z" direction side of the optical module 4. The holder 15 is provided with a holder cut-out part 13 formed by cutting out an edge on the "−Z" direction side of a holder side wall 14 which structures a side face on the "+Y" direction side of the movable body 5. The flexible printed circuit board 9 is extended to the "+X" direction side with respect to the movable body 5 through the holder cut-out part 13.

As shown in FIGS. 3 and 4, a first magnet 61X is fixed to a side face on the "−Y" direction side of the movable body 5. Further, a second magnet 61Y is fixed to a side face on the "−X" direction side of the movable body 5. The first magnet 61X and the second magnet 61Y are polarized and magnetized in the "Z"-axis direction. As shown in FIG. 4, each of diagonal portions in the first axis "R1" direction of the holder 15 is fixed with a gimbal frame receiving member 16.

(Fixed Body)

As shown in FIGS. 2 and 3, the fixed body 8 includes a case 19 which surrounds an outer peripheral side of the movable body 5, a base 20 which is fixed to the case 19 from the "−Z" direction side, and a cover 21 which covers the case 19 from the "+Z" direction side. The case 19, the base 20 and the cover 21 are made of metal. The case 19 is accommodated between the base 20 and the cover 21. As shown in FIGS. 1 and 3, parts of the movable body 5 and the gimbal mechanism 7 are protruded to the "+Z" direction side from an opening part 21a of the cover 21.

Further, the fixed body 8 includes a wiring case 22 which covers the flexible printed circuit board 9, which is extended from the movable body 5 to the "+X" direction side, from the "+Z" direction side. The wiring case 22 is made of resin. The base 20 is extended to the "+X" direction side from the case 19 and covers the wiring case 22 from the "−Z" direction side. As shown in FIG. 3, the flexible printed circuit board 9 is accommodated between the base 20 and the wiring case 22.

As shown in FIGS. 4 and 5, a pair of side walls 25 and 26 extended in the "X"-axis direction is disposed at both ends in the "Y"-axis direction of the wiring case 22. The wiring case 22 is provided with a side wall 27, which is connected with end parts on the "−X" direction side of the side walls 25 and 26, and a circuit board fixing part 80 which is connected with end parts on the "+X" direction side of the side walls 25 and 26. The flexible printed circuit board 9 is passed through a cut-out part 28 formed by cutting out an edge on the "−Z" direction side of the side wall 27 extended in the "Y"-axis direction and is extended between a pair of the side walls 25 and 26.

The side walls 25, 26 and 27 are protruded to the "−Z" direction side from an outer peripheral edge of the end plate part 29 which is disposed at an end part on the "+Z" direction side of the wiring case 22. The circuit board fixing part 80 is protruded to the "−Z" direction side from an edge on the "+X" direction side of the end plate part 29. As described below, the flexible printed circuit board 9 is fixed to the circuit board fixing part 80.

As shown in FIGS. 3 and 4, the first coil 62X is fixed to a side face on the "−Y" direction of the case 19. Further, the second coil 62Y is fixed to a side face on the "−X" direction side of the case 19. As shown in FIG. 2, the first coil 62X and the second coil 62Y are air core coils in an elliptical shape which is long in a circumferential direction. The first coil 62X and the second coil 62Y are electrically connected with the flexible printed circuit board 10. The flexible printed circuit board 10 is extended along a side face on the "−X" direction side and a side face on the "−Y" direction side of the case 19. The flexible printed circuit board 10 is extended from the side face on the "−Y" direction side of the case 19 to a side face on the "−Y" direction side of the wiring case 22 and is connected with a power feeding circuit board 11 disposed on the end plate part 29 of the wiring case 22.

As shown in FIGS. 2 and 4, a gimbal frame receiving member 16 is fixed to each of diagonal portions of the case 19 in the second axis "R2" direction. The gimbal frame receiving member 16 which is fixed to the case 19 is the same member as the gimbal frame receiving member 16 fixed to the holder 15 of the movable body 5 and is provided with a protruding curved face (not shown) which is protruded to an inner side in the radial direction.

As shown in FIGS. 2 and 3, the case 19 is provided with a case cut-out part 17 which is formed by cutting out an edge on the "−Z" direction side of the case side wall 18 disposed on the "+X" direction side of the movable body 5. The flexible printed circuit board 9 extended from the movable body 5 is extended to an inside of the wiring case 22 through the case cut-out part 17 and the cut-out part 28 of the wiring case 22 and then is extended from the wiring case 22 to the "+X" direction side.

(Gimbal Mechanism)

As shown in FIGS. 2 through 4, the gimbal mechanism 7 includes a gimbal frame 70, a first connection mechanism 71 and a second connection mechanism 72. The first connection mechanism 71 turnably connects the gimbal frame 70 with the movable body 5 around the first axis "R1". The second connection mechanism 72 turnably connects the gimbal frame 70 with the case 19 around the second axis "R2". When the gimbal mechanism 7 is structured, the movable body 5 is capable of being swung with a swing center "P" (see FIG. 3), which is an intersecting point where the optical axis "L", the first axis "R1" and the second axis "R2" intersect, as a center.

The gimbal frame 70 is structured of a plate spring made of metal. As shown in FIGS. 1 and 2, the gimbal frame 70 is provided with a gimbal frame main body part 74 having an opening part 73 in which the lens-barrel 4a is disposed, a pair of first gimbal frame extended parts 75 which are protruded from the gimbal frame main body part 74 toward both sides in the first axis "R1" direction and are extended to the "−Z" direction side, and a pair of second gimbal frame extended parts 76 which are protruded from the gimbal frame main body part 74 toward both sides in the second axis "R2" direction and are extended to the "−Z" direction side.

The first connection mechanism 71 is structured of the gimbal frame receiving members 16 which are fixed to the diagonal portions in the first axis "R1" direction of the holder 15 and a pair of the first gimbal frame extended parts 75. Each of the gimbal frame receiving members 16 is provided with a protruding curved face (not shown) which is protruded to an inner side in the radial direction. On the other hand, a tip end of each of the first gimbal frame extended parts 75 is provided with a recessing curved face which is recessed to the inner side in the radial direction. The first gimbal frame extended part 75 is inserted into a space between each of the gimbal frame receiving members 16 and the holder 15 and the protruding curved face is point-contacted with the recessing curved face and thereby, the first connection mechanism 71 is structured.

The second connection mechanism 72 is structured of the gimbal frame receiving members 16 which are fixed to the diagonal portions in the second axis "R2" direction of the case 19 and a pair of the second gimbal frame extended parts 76. Each of the gimbal frame receiving members 16 is provided with a protruding curved face (not shown) which is protruded to an inner side in the radial direction. On the other hand, each of the second gimbal frame extended parts 76 is provided with a recessing curved face which is recessed to the inner side in the radial direction. The second gimbal frame extended part 76 is inserted into a space between each of the gimbal frame receiving members 16 and the case 19 and the protruding curved face is point-contacted with the recessing curved face and thereby, the second connection mechanism 72 is structured.

(Shake Correction Drive Mechanism)

When the gimbal mechanism 7 is structured, the first magnet 61X fixed to a side face on the "−Y" direction side of the movable body 5 and the first coil 62X fixed to the case 19 structure the first shake correction drive mechanism 6X. Therefore, the movable body 5 is turned around the "X"-axis by feeding power to the first coil 62X. Further, the second magnet 61Y fixed to a side face on the "−X" direction side of the movable body 5 and the second coil 62Y fixed to the case 19 structure the second shake correction drive mechanism 6Y. Therefore, the movable body 5 is turned around the "Y"-axis by feeding power to the second coil 62Y. The shake correction drive mechanism 6 is structured to turn the movable body 5 around the first axis "R1" and around the second axis "R2" by combining turning around the "X"-axis of the movable body 5 by the first shake correction drive mechanism 6X with turning around the "Y"-axis of the movable body 5 by the second shake correction drive mechanism 6Y.

(Flexible Printed Circuit Board)

As shown in FIG. 3, the flexible printed circuit board 9 is provided with an extending part 91 which is extended to the "+X" direction side from a bottom part of the movable body 5, an inclination part 92 which is extended from the extending part 91 in a direction inclined with respect to the "+X" direction and the "+Z" direction, a flat face part 93 extended from the inclination part 92 to the "+X" direction, a first circuit board 94 connected with an end part on the "+X" direction side of the flat face part 93, an extension part 95 extended from the first circuit board 94 to the "+X" direction side, and a second circuit board 96 which is connected with a tip end of the extension part 95. The extension part 95 and the second circuit board 96 of the flexible printed circuit board 9 are extended from the wiring case 22 to the "+X" direction side. The second circuit board 96 is an external connection board which is to be connected with an optical device on which the optical unit 1 with a shake correction function is mounted.

As shown in FIG. 2, the flexible printed circuit board 9 is provided with a branched part 97, which is extended from an end part on the "+Y" direction side of the first circuit board 94 to the "+Z" direction side, and a third circuit board 98 connected with a tip end of the branched part 97. As shown in FIG. 1, the branched part 97 is extended to the "+Z" direction side through a space between a groove part 23 provided in a side face on the "+X" direction side of the wiring case 22 and a standing-up part 24 provided at an end part on the "+X" direction side of the base 20. The third circuit board 98 is disposed on an end plate part 29 of the wiring case 22 and its end part on the "−Y" direction side is overlapped with the power feeding circuit board 11. As described above, the power feeding circuit board 11 is connected with the flexible printed circuit board 10 for power feeding to the shake correction drive mechanism 6. Therefore, electric power is supplied to the flexible printed circuit board 10 through the flexible printed circuit board 9 by connecting terminals provided in the third circuit board 98 with terminals provided in the power feeding circuit board 11.

In the flexible printed circuit board 9, the first circuit board 94, the second circuit board 96 and the third circuit board 98 are structured of a rigid circuit board made of glass epoxy resin or the like, and other portions (extending part 91, inclination part 92, flat face part 93, extension part 95 and branched part 97) are structured of a flexible circuit board 90 (see FIG. 3) made of polyimide resin or the like.

As shown in FIG. 3, in this embodiment, the portion structured of the flexible circuit board 90 in the flexible printed circuit board 9 is formed in a multilayer structure. In this case, the multilayer structure may utilize all structures that a plurality of layers is laminated. In this embodiment, the flexible circuit board 90 is structured to be a three-layered structure comprising a first layer 901, a second layer 902 and a third layer 903. However, the number of layers is not limited to three. Further, each layer may be structured so that wiring is formed only on one side or on both sides. In this embodiment, each layer is provided with a non-adhesive region which is not adhesively bonded to another layer, but each layer may be provided with no non-adhesive region.

As shown in FIG. 3, the flexible printed circuit board 9 is provided with a first bent part "B1" connecting the extending part 91 with the inclination part 92 and a second bent part "B2" connecting the inclination part 92 with the flat face part 93. The first bent part "B1" and the second bent part "B2" are bent in an obtuse-angle shape. When the flexible circuit board is bent at two positions of the first bent part "B1" and the second bent part "B2", the flat face part 93 of the flexible printed circuit board 9 is disposed on a side where the swing center "P" of the movable body 5 is located (in other words, "+Z" direction side) with respect to the extending part 91. In a case that the flat face part 93 is located on the "+Z" direction side with respect to the extending part 91, when the movable body 5 is swung and inclined to the "−Z" direction side, the flexible printed circuit board 9 is hard to interfere with the base 20.

As shown in FIG. 3, the flat face part 93 is disposed on an imaginary plane "V" intersecting the optical axis "L". In this embodiment, an intersecting point of the imaginary plane "V" with the optical axis "L" is coincided with the swing center "P" of the movable body 5. Therefore, a shape of the flexible printed circuit board 9 is formed so that a load for resiliently bending the flat face part 93 is small when the movable body 5 is to be swung with the swing center "P" as a center.

The flat face part 93 is slightly inclined with respect to the "X"-axis direction, and its inclination direction is a direction toward an object side ("+Z" direction side) as approaching the movable body 5. In this embodiment, a state that the intersecting point of the imaginary plane "V" where the flat face part 93 is disposed with the optical axis "L" is coincided with the swing center "P" is obtained by inclining the flat face part 93.

The flexible printed circuit board 9 is provided with a fixed part which is fixed to the fixed body 8. In this embodiment, the first circuit board 94 is the fixed part. As shown in FIG. 3, the fixed body 8 includes a circuit board fixing part 80 which is separated in the "X"-axis direction from the movable body 5, and the first circuit board 94 (fixed part) is fixed to the circuit board fixing part 80. The movable body 5 is capable of being swung while the flat face part 93 provided between the circuit board fixing part 80 and the movable body 5 is resiliently bent.

As shown in FIGS. 4 and 5, the circuit board fixing part 80 is extended in the "Y" direction at an end part on the "+X" direction side of the wiring case 22. The circuit board fixing part 80 is provided with a fixable region to which the first circuit board 94 is capable of being fixed. In this embodiment, the fixable region is a fixing face 81 provided at a tip end on the "−Z" direction of the circuit board fixing part 80. The first circuit board 94 is positioned in the "Z"-axis direction by abutting with the fixing face 81 from the "−Z" direction side.

As shown in FIG. 3, the fixing face 81 is slightly inclined with respect to the "X"-axis direction and its inclination angle is the same as an inclination angle of the flat face part 93. The flat face part 93 and the first circuit board 94 of the flexible printed circuit board 9 are extended straight, and the first circuit board 94 is disposed on the imaginary plane "V" where the flat face part 93 is disposed.

As shown in FIG. 4, a width "D1" in the "Y"-axis direction (second direction) of the fixing face 81 is larger than a width "D0" in the "Y"-axis direction of the first circuit board 94. Therefore, when the first circuit board 94 is to be fixed to the circuit board fixing part 80, a fixing position of the first circuit board 94 is capable of being shifted in the "Y"-axis direction within a range of the width "D1" in the "Y"-axis direction of the fixing face 81. Further, a width "D3" in the "X"-axis direction (first direction) of the fixing face 81 is larger than a width "D2" in the "X"-axis direction of the first circuit board 94. Therefore, when the first circuit board 94 is to be fixed to the circuit board fixing part 80, a fixing position of the first circuit board 94 is capable of being shifted in the "X"-axis direction within a range of the width "D3" in the "X"-axis direction of the fixing face 81.

As shown in FIGS. 4 and 5, the flat face part 93 is provided with a curved part which curves on the imaginary plane "V". In this embodiment, two curved parts, i.e., a first curved part 931 and a second curved part 932 are provided. The flat face part 93 is curved two times in reverse directions on the imaginary plane "V" and is extended in the "Y"-axis direction while meandering. The flat face part 93 is provided with a first straight part 933 connected with the inclination part 92 through the second bent part "B2", a first curved part 931 which is curved in a reverse direction from the first straight part 933, a second straight part 934 extended in substantially parallel with the first straight part 933 from the first curved part 931, a second curved part 932 which is curved in a reverse direction from the second straight part 934, and a third straight part 935 which is extended in substantially parallel with the second straight part 934 from the second curved part 932.

(Bending Assist Member)

Figure 6A:
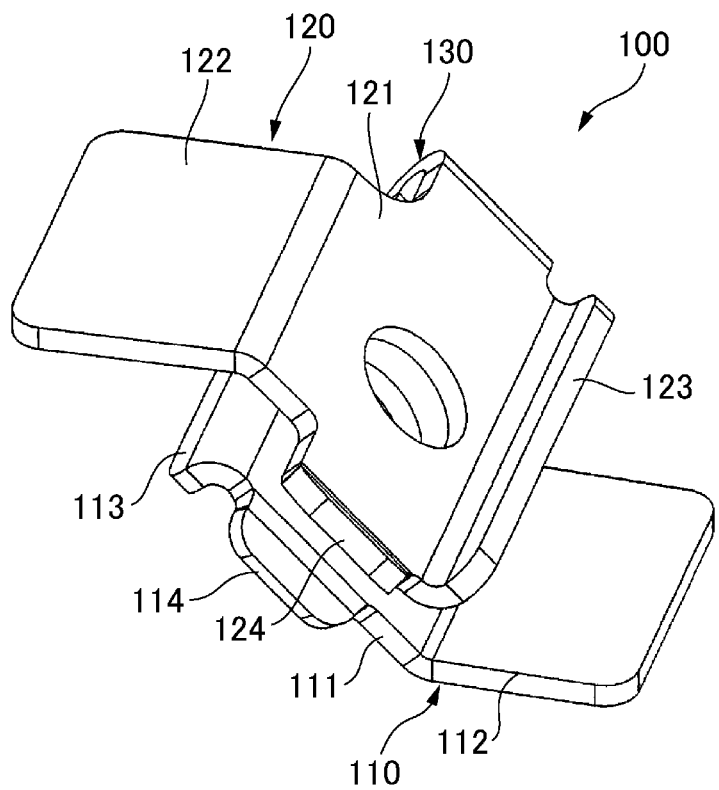
FIG. 6A is a perspective view showing a bending assist member.
Figure 6B:
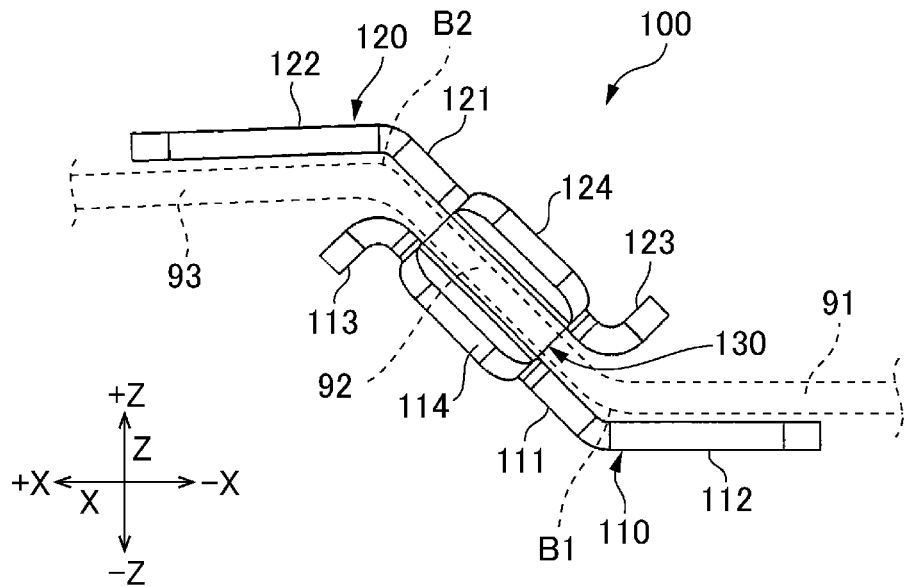
FIG. 6B is a side view showing the bending assist member.

FIG. 6A is a perspective view showing a bending assist member 100. FIG. 6B is a side view showing the bending assist member 100. The bending assist member 100 is attached to the inclination part 92 of the flexible printed circuit board 9 so as to hold the first bent part "B1" and the second bent part "B2" and maintain its bending shape. In this embodiment, the bending assist member 100 is a metal plate member. The bending assist member 100 is provided with a first bent plate 110 which supports the inclination part 92 and the extending part 91 from the "−Z" direction side, a second bent plate 120 which supports the inclination part 92 and the flat face part 93 from the "+Z" direction side, and a curve-shaped folded part 130 which connects the first bent plate 110 with the second bent plate 120.

The first bent plate 110 is provided with a first inclination plate 111 along the inclination part 92 and a first support plate 112 which is bent at an obtuse angle with respect to the first inclination plate 111. The second bent plate 120 is provided with a second inclination plate 121 along the inclination part 92 and a second support plate 122 which is bent at an obtuse angle with respect to the second inclination plate 121. The first inclination plate 111 and the second inclination plate 121 face each other with a space to which the inclination part 92 is capable of being inserted. The folded part 130 connects one side end of the first inclination plate 111 with one side end of the second inclination plate 121. The other side ends of the first inclination plate 111 and the second inclination plate 121 are provided with guide parts 114 and 124 which guide insertion of the inclination part 92.

The first support plate 112 is extended from an end part on the "−Z" direction of the first inclination plate 111 to the "−X" direction side, and the second support plate 122 is extended from an end part on the "+Z" direction side of the second inclination plate 121 to the "+X" direction side. An end part on the "+Z" direction side of the first inclination plate 111 is provided with a first bent part 113 which is bent at a substantially right angle on an opposite side to the second inclination plate 121. An end part on the "−Z" direction side of the second inclination plate 121 is provided with a second bent part 123 which is bent at a substantially right angle on an opposite side to the first inclination plate 111.

In the bending assist member 100, a bending angle of the first inclination plate 111 with respect to the first support plate 112 is coincided with a bending angle of the first bent part "B1", and a bending angle of the second inclination plate 121 with respect to the second support plate 122 is coincided with a bending angle of the second bent part "B2". Therefore, when the inclination part 92 is held by being inserted into a space between the first inclination plate 111 and the second inclination plate 121, a bending shape of the first bent part "B1" is maintained by the first support plate 112 and a bending shape of the second bent part "B2" is maintained by the second support plate 122.

(Principal Operations and Effects in this Embodiment)

As described above, the optical unit 1 with a shake correction function in this embodiment includes the movable body 5 having the optical module 4, the fixed body 8, the gimbal mechanism 7 which swingably supports the movable body 5 with respect to the fixed body 8 around the first axis "R1" intersecting the optical axis "L" and swingably supports the movable body 5 around the second axis "R2" intersecting the optical axis "L" and the first axis "R1", the shake correction drive mechanism 6 structured to swing the movable body 5 around the first axis "R1" and around the second axis "R2", and the flexible printed circuit board 9 which is extended from the movable body 5. In a case that a direction perpendicular to the optical axis "L" is referred to as an "X"-axis direction (first direction) and a direction perpendicular to the optical axis "L" and perpendicular to the "X"-axis direction (first direction) is referred to as a "Y"-axis direction (second direction), the fixed body 8 is provided with the circuit board fixing part 80 which is separated in the "X"-axis direction (first direction) from the movable body 5. The flexible printed circuit board 9 is provided with the flat face part 93 which is disposed between the movable body 5 and the circuit board fixing part 80 in the imaginary plane "V" intersecting the optical axis "L", and the first circuit board 94 (fixed part) which is fixed to the circuit board fixing part 80. The flat face part 93 is provided with the curved part (first curved part 931 and second curved part 932) which is curved in the imaginary plane "V", and the first circuit board 94 (fixed part) is positioned in the optical axis direction by abutting with the circuit board fixing part 80. The circuit board fixing part 80 is provided with the fixable region (fixing face 81) which is capable of fixing the first circuit board 94 (fixed part), and the width "D1" in the "Y"-axis direction (second direction) of the fixable region (fixing face 81) is larger than the width "D0" in the "Y"-axis direction (second direction) of the first circuit board 94 (fixed part).

As described above, in this embodiment, the flexible printed circuit board 9 is provided with the flat face part 93 which is disposed in the imaginary plane "V" intersecting the optical axis "L", and the flat face part 93 is provided with the curved part (first curved part 931 and second curved part 932) which is curved in the imaginary plane "V". According to this structure, when the movable body 5 is swung, the flat face part 93 is easily bent resiliently and thus, movement of the movable body 5 is hard to be obstructed. Therefore, a swing load can be restrained from increasing when the movable body 5 is swung. Further, a circuit board shape which is easily resiliently bent is obtained without performing folding work of the flexible printed circuit board 9 and thus, time and labor for providing the flexible printed circuit board 9 can be reduced.

Further, in this embodiment, the width in the "Y"-axis direction (second direction) of the fixable region (fixing face 81) of the circuit board fixing part 80 provided in the fixed body 8 is larger than that of the first circuit board 94 (fixed part) provided in the flexible printed circuit board 9. Therefore, when the flexible printed circuit board 9 is to be fixed to the circuit board fixing part 80, propping and deformation of the flexible printed circuit board 9 can be restrained by shifting a position of the first circuit board 94 (fixed part) in the "Y"-axis direction (second direction) and the flexible printed circuit board 9 can be disposed in a natural state. Accordingly, application of an unintended force to the movable body 5 due to lowering of shape accuracy of the flexible printed circuit board 9 can be restrained. As a result, deterioration of actuator characteristics due to lowering of shape accuracy of the flexible printed circuit board 9 can be restrained. For example, there may be prevented that an initial position of the movable body 5 is deviated and that a smooth movement of the movable body 5 is obstructed. Further, since a swing load to the movable body 5 can be restrained, current consumption when a shake correction is performed can be reduced.

In this embodiment, the width "D3" in the "X"-axis direction (first direction) of the fixable region (fixing face 81) to which the first circuit board 94 (fixed part) of the flexible printed circuit board 9 is fixed is larger than the width "D2" in the "X"-axis direction (first direction) of the first circuit board 94 (fixed part). Therefore, when the flexible printed circuit board 9 is to be fixed to the circuit board fixing part 80, propping and deformation of the flexible printed circuit board 9 can be restrained by shifting a position of the first circuit board 94 (fixed part) in the "X"-axis direction (first direction). Accordingly, deterioration of the actuator characteristics due to lowering of the shape accuracy of the flexible printed circuit board 9 can be restrained.

In this embodiment, the flat face part 93 of the flexible printed circuit board 9 is inclined with respect to the "X"-axis direction (first direction). Further, the circuit board fixing part 80 is provided with the fixing face 81 with which the first circuit board 94 (fixed part) is abutted, and the fixing face 81 is inclined in the same direction as that of the flat face part 93. Therefore, an inclination of the first circuit board 94 (fixed part) fixed to the fixing face 81 can be set in the same inclination as that of the flat face part 93 and thus, the flat face part 93 and the first circuit board 94 (fixed part) can be disposed straight without bending. As a result, deformation of the flexible printed circuit board 9 can be restrained and thus, application of an unintended force to the movable body 5 from the flexible printed circuit board 9 can be restrained. Further, interference of the flexible printed circuit board 9 with the fixed body 8 can be reduced.

In this embodiment, the flat face part 93 of the flexible printed circuit board 9 is inclined in a direction toward a side in the optical axis direction where the swing center "P" of the movable body 5 is located (in other words, the "+Z" direction side) as approaching the movable body 5 in the "X"-axis direction (first direction). When the flexible printed circuit board 9 is inclined in such a direction, a distance between the imaginary plane "V" where the flexible printed circuit board 9 is disposed and the swing center "P" of the movable body 5 can be made small. Therefore, increase of a swing load to the movable body 5 due to resilient bending of the flexible printed circuit board 9 can be restrained.

In this embodiment, an intersecting point of the imaginary plane "V" with the optical axis "L" is coincided with the swing center "P" of the movable body 5 and thus, increase of a swing load to the movable body 5 due to resilient bending of the flexible printed circuit board 9 can be restrained. In accordance with an embodiment of the present invention, an intersecting point of the imaginary plane "V" with the optical axis "L" is not required to be coincided with the swing center "P" of the movable body 5. However, it is preferable that an intersecting point of the imaginary plane "V" with the optical axis "L" is close to the swing center "P". Further, it is preferable that the flat face part 93 intersects the first axis "R1" and the second axis "R2". In a case that the flat face part 93 intersects the first axis "R1" and the second axis "R2", when the movable body 5 is swung around the first axis "R1" and around the second axis "R2", a load applied to the movable body 5 can be reduced when the flat face part 93 follows the movable body 5 to be resiliently bent. Therefore, increase of a swing load to the movable body 5 due to resilient bending of the flexible printed circuit board 9 can be restrained.

In this embodiment, the flat face part 93 of the flexible printed circuit board 9 is provided with the first curved part 931 and the second curved part 932 which are curved in reverse directions in the imaginary plane "V". More specifically, the flat face part 93 is provided with the first straight part 933 extended in the "X"-axis direction (first direction), the first curved part 931 which is curved from the first straight part 933 in a reverse direction, the second straight part 934 which is extended from the first curved part 931 in substantially parallel with the first straight part 933, the second curved part 932 which is curved from the second straight part 934 in a reverse direction, and the third straight part 935 which is extended from the second curved part 932 in substantially parallel with the second straight part 934. As described above, in a case that a planar shape of the flexible printed circuit board 9 is formed in a meandering shape, when the movable body 5 is swung around the first axis "R1" and around the second axis "R2" which intersect the optical axis "L", the flexible printed circuit board 9 is capable of being easily resiliently bent. Therefore, a swing load to the movable body 5 can be restrained from increasing. In accordance with an embodiment of the present invention, the flat face part 93 is not limited to be formed in a shape which is bent twice in reverse directions and may be formed in a shape which is bent once in a reverse direction, or may be formed in a shape which is bent three times or more in reverse directions.

In this embodiment, the flexible printed circuit board 9 is provided with the extending part 91 which is extended from the movable body 5 to a side ("+X" direction side) where the circuit board fixing part 80 is located, the first bent part "B1"

which is bent from the extending part 91 in a direction ("+Z" direction side) approaching the swing center "P" of the movable body 5 in the optical axis direction, and the second bent part "B2" which is bent in a direction along the imaginary plane "V" between the first bent part "B1" and the flat face part 93. As described above, when the flexible printed circuit board 9 is bent at two positions, a position in the optical axis direction of the flexible printed circuit board 9 can be brought close to the swing center "P" of the movable body 5. Therefore, increase of a swing load to the movable body 5 due to resilient bending of the flexible printed circuit board 9 can be restrained.

In this embodiment, the bending assist member 100 which holds the first bent part "B1" and the second bent part "B2" of the flexible printed circuit board 9 is provided and thus, shapes of the first bent part "B1" and the second bent part "B2" can be maintained. Therefore, in a state that a position in the optical axis direction of the flat face part 93 is brought close to the swing center "P" of the movable body 5, a shape of the flexible printed circuit board 9 is easily maintained.

Other Embodiments

The embodiment described above is that the movable body 5 is swung in a pitching direction and in a yawing direction and thereby a shake correction around two axes is performed. However, the present invention may be applied to an optical unit with a shake correction function which is structured to swing the movable body 5 around three axes.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An optical unit with a shake correction function, comprising:
    a movable body comprising an optical module;
    a fixed body;
    a swing support mechanism which is structured to swingably support the movable body with respect to the fixed body around a first axis intersecting an optical axis and is structured to swingably support the movable body around a second axis intersecting the optical axis and the first axis;
    a shake correction drive mechanism, structured to swing the movable body around the first axis and around the second axis; and
    a flexible printed circuit board which is extended from the movable body;
    wherein in a case that a direction perpendicular to the optical axis is referred to as a first direction, and a direction perpendicular to the optical axis and perpendicular to the first direction is referred to as a second direction,
    the fixed body comprises a circuit board fixing part which is separated in the first direction from the movable body;
    the flexible printed circuit board comprises:
        a flat face part which is disposed in an imaginary plane intersecting the optical axis between the movable body and the circuit board fixing part and is inclined with respect to the first direction; and
        a fixed part which is fixed to the circuit board fixing part;
    the flat face part comprises a curved part which is curved in the imaginary plane;
    the fixed part is positioned in a direction of the optical axis by abutting with the circuit board fixing part;
    the circuit board fixing part comprises a fixing face and a fixable region which is capable of fixing the fixed part on the fixing face with which the fixed part is abutted;
    the fixing face is inclined in a same direction as the flat face part; and
    a width in the second direction of the fixable region is larger than a width in the second direction of the fixed part.

2. The optical unit with a shake correction function according to claim 1, wherein
    a width in the first direction of the fixable region is larger than a width in the first direction of the fixed part.

3. The optical unit with a shake correction function according to claim 2, wherein
    the flat face part is inclined in a direction toward a side where a swing center of the movable body is located in the direction of the optical axis as approaching the movable body in the first direction.

4. The optical unit with a shake correction function according to claim 2, wherein
    an intersecting point of the imaginary plane with the optical axis is coincided with a swing center of the movable body.

5. The optical unit with a shake correction function according to claim 1, wherein
    an intersecting point of the imaginary plane with the optical axis is coincided with a swing center of the movable body.

6. The optical unit with a shake correction function according to claim 1, wherein
    the curved part comprises a first curved part and a second curved part which are curved in reverse directions in the imaginary plane, and
    the flat face part comprises:
        a first straight part which is extended in the first direction;
        the first curved part which is curved from the first straight part in a reverse direction;
        a second straight part which is extended from the first curved part in substantially parallel with the first straight part;
        the second curved part which is curved from the second straight part in a reverse direction; and
        a third straight part which is extended from the second curved part in substantially parallel with the second straight part.

7. The optical unit with a shake correction function according to claim 6, wherein
    the flexible printed circuit board comprises:
        an extending part which is extended from the movable body to a side where the circuit board fixing part is located;
        a first bent part which is bent from the extending part in a direction approaching a swing center of the movable body in the direction of the optical axis; and a second bent part which is bent in a direction along the imaginary plane between the first bent part and the flat face part.

8. The optical unit with a shake correction function according to claim 7, further comprising:
a bending assist member which holds the first bent part and the second bent part.

9. The optical unit with a shake correction function according to claim 1, wherein
the flexible printed circuit board comprises:
an extending part which is extended from the movable body to a side where the circuit board fixing part is located;
a first bent part which is bent from the extending part in a direction approaching a swing center of the movable body in the direction of the optical axis; and
a second bent part which is bent in a direction along the imaginary plane between the first bent part and the flat face part.

10. The optical unit with a shake correction function according to claim 9, further comprising:
a bending assist member which holds the first bent part and the second bent part.

11. The optical unit with a shake correction function according to claim 1, wherein
the flat face part is inclined in a direction toward a side where a swing center of the movable body is located in the direction of the optical axis as approaching the movable body in the first direction.

12. The optical unit with a shake correction function according to claim 11, wherein
the curved part comprises a first curved part and a second curved part which are curved in reverse directions in the imaginary plane, and
the flat face part comprises:
a first straight part which is extended in the first direction;
the first curved part which is curved from the first straight part in a reverse direction;
a second straight part which is extended from the first curved part in substantially parallel with the first straight part;
the second curved part which is curved from the second straight part in a reverse direction; and
a third straight part which is extended from the second curved part in substantially parallel with the second straight part.

13. The optical unit with a shake correction function according to claim 11, wherein
the flexible printed circuit board comprises:
an extending part which is extended from the movable body to a side where the circuit board fixing part is located;
a first bent part which is bent from the extending part in a direction approaching a swing center of the movable body in the direction of the optical axis; and
a second bent part which is bent in a direction along the imaginary plane between the first bent part and the flat face part.

14. The optical unit with a shake correction function according to claim 13, further comprising:
a bending assist member which holds the first bent part and the second bent part.

15. An optical unit with a shake correction function, comprising:
a movable body comprising an optical module;
a fixed body;
a swing support mechanism which is structured to swingably support the movable body with respect to the fixed body around a first axis intersecting an optical axis and is structured to swingably support the movable body around a second axis intersecting the optical axis and the first axis;
a shake correction drive mechanism, structured to swing the movable body around the first axis and around the second axis; and
a flexible printed circuit board which is extended from the movable body;
wherein in a case that a direction perpendicular to the optical axis is referred to as a first direction, and a direction perpendicular to the optical axis and perpendicular to the first direction is referred to as a second direction,
the fixed body comprises a circuit board fixing part which is separated in the first direction from the movable body;
the flexible printed circuit board comprises:
a flat face part, disposed in an imaginary plane intersecting the optical axis between the movable body and the circuit board fixing part; and
a fixed part which is fixed to the circuit board fixing part;
the flat face part comprises a curved part which is curved in the imaginary plane;
the fixed part is positioned in a direction of the optical axis by abutting with the circuit board fixing part;
the circuit board fixing part comprises a fixable region which is capable of fixing the fixed part; and
a width in the second direction of the fixable region is larger than a width in the second direction of the fixed part,
wherein an intersecting point of the imaginary plane with the optical axis is coincided with a swing center of the movable body.

16. The optical unit with a shake correction function according to claim 15, wherein
the curved part comprises a first curved part and a second curved part which are curved in reverse directions in the imaginary plane, and
the flat face part comprises:
a first straight part which is extended in the first direction;
the first curved part which is curved from the first straight part in a reverse direction;
a second straight part which is extended from the first curved part in substantially parallel with the first straight part;
the second curved part which is curved from the second straight part in a reverse direction; and
a third straight part which is extended from the second curved part in substantially parallel with the second straight part.

17. The optical unit with a shake correction function according to claim 15, wherein
the flexible printed circuit board comprises:
an extending part which is extended from the movable body to a side where the circuit board fixing part is located;
a first bent part which is bent from the extending part in a direction approaching a swing center of the movable body in the direction of the optical axis; and
a second bent part which is bent in a direction along the imaginary plane between the first bent part and the flat face part.

18. The optical unit with a shake correction function according to claim 17, further comprising:
a bending assist member which holds the first bent part and the second bent part.

* * * * *